(12) United States Patent
Jain et al.

(10) Patent No.: US 9,251,906 B1
(45) Date of Patent: Feb. 2, 2016

(54) DATA STROBE SIGNAL GENERATION FOR FLASH MEMORY

(71) Applicant: FREESCALE SEMICONDUCTOR, INC., Austin, TX (US)

(72) Inventors: Aarul Jain, New Delhi (IN); Neha Agarwal, New Delhi (IN); Rakesh Pandey, Austin, TX (US); Deboleena Minz Sakalley, Ghaziabad (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/715,544

(22) Filed: May 18, 2015

(51) Int. Cl.
  *G11C 7/00* (2006.01)
  *G11C 16/32* (2006.01)
  *G11C 16/26* (2006.01)

(52) U.S. Cl.
  CPC ............... *G11C 16/32* (2013.01); *G11C 16/26* (2013.01)

(58) Field of Classification Search
  CPC .............................. G11C 16/32; G11C 16/26
  USPC .................... 365/193, 194, 233.1, 233.12
  See application file for complete search history.

(56) References Cited

U.S. PATENT DOCUMENTS

| | | | | |
|---|---|---|---|---|
| 6,247,138 | B1 * | 6/2001 | Tamura ................ | G11C 7/1072 713/400 |
| 6,316,980 | B1 | 11/2001 | Vogt et al. | |
| 6,401,213 | B1 | 6/2002 | Jeddeloh | |
| 6,570,944 | B2 * | 5/2003 | Best .......................... | G06F 1/10 327/161 |
| 6,940,768 | B2 | 9/2005 | Dahlberg et al. | |
| 7,119,596 | B2 * | 10/2006 | Kong ..................... | H03K 5/133 327/158 |
| 7,167,035 | B2 | 1/2007 | Cao | |
| 7,509,223 | B2 | 3/2009 | Chong et al. | |
| 7,671,579 | B1 * | 3/2010 | Chong ............... | G01R 31/3016 324/76.35 |
| 7,671,648 | B2 * | 3/2010 | Kwak .................. | G11C 7/1072 327/156 |
| 7,948,817 | B2 * | 5/2011 | Coteus ................ | G06F 13/1689 365/194 |
| 8,065,553 | B2 * | 11/2011 | Tamura ........................ | 331/1 R |
| 8,098,535 | B2 * | 1/2012 | Maclaren ............. | G11C 7/1051 327/141 |
| 8,164,372 | B2 * | 4/2012 | Mitsubori ............ | G11C 7/1051 327/149 |
| 8,355,294 | B2 * | 1/2013 | Makwana ........... | G06F 13/1689 365/189.05 |
| 8,453,096 | B2 * | 5/2013 | Magee ..................... | G11C 7/04 716/132 |
| 8,504,788 | B2 * | 8/2013 | Stott ....................... | G11C 7/02 365/193 |
| 8,941,425 | B2 * | 1/2015 | Song ..................... | H04K 5/153 327/161 |
| 8,988,967 | B2 * | 3/2015 | Truong ................ | G11C 7/1066 365/193 |
| 9,035,684 | B2 * | 5/2015 | Jung ..................... | H03L 7/0802 327/149 |

* cited by examiner

Primary Examiner — Viet Q Nguyen

(74) Attorney, Agent, or Firm — Charles E. Bergere

(57) ABSTRACT

A method and circuit for generating a shifted strobe signal for sampling data read from a memory device includes generating an instantiation of a shifted strobe signal by applying both a coarse adjustment delay value and a fine adjustment delay value to a clock. Data read from a predetermined, programmed memory location or locations of the memory device is sampled using the shifted strobe signal. At least one of the applying steps is repeated and the read data is sampled again using the current instantiation of the shifted strobe signal. The process is repeated until the current instantiation of the shifted strobe signal is aligned with a valid data window of the memory device. The method can be used in both single data rate and double data rate applications.

17 Claims, 5 Drawing Sheets

DATA STROBE SIGNAL GENERATION FOR FLASH MEMORY

BACKGROUND

The present invention relates generally to integrated circuits, and more particularly, to a data synchronization circuit that generates a local data strobe signal to synchronize read operations with a processor initiating read operations.

Some flash memory drive suppliers define a valid data window during which data is valid and available for capture. As clock frequencies increase, the valid data window is narrowed. In addition, on-chip variations (OCV), such as process variations, voltage fluctuations, and temperature variations, can cause the valid data window to shift in response to the varying operating conditions.

Flash drive vendors are redefining how the valid data window is determined, moving from a defined window during which data is valid and available for data capture to a floating valid data window that shifts with variations in operating conditions. Since the valid data window shifts with operating conditions, consideration must be given to a technique not only to establish where valid data can be found at one set of operating conditions but also to re-evaluate where valid data can be found as operating conditions change.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

A method for generating a shifted strobe signal for sampling data read from a memory device includes generating an instantiation of a shifted strobe signal by applying a coarse adjustment delay value to a clock signal and applying a fine adjustment delay value to the clock signal. Data read from predetermined, programmed memory location or locations of the memory device is sampled using the shifted strobe signal. At least one of the applying steps is repeated to generate an updated instantiation of the shifted data strobe, and the data is re-read and re-sampled using the updated instantiation of the shifted data strobe until the updated instantiation of the shifted data strobe aligns with a valid data window of the memory device.

A circuit for generating a shifted strobe signal for sampling data read from a memory device includes a coarse adjustment circuit that applies a coarse adjustment delay value to a clock signal and a fine adjustment circuit that applies a fine adjustment delay value to a clock signal. A control circuit controls the coarse and fine adjustment circuits to systematically sequence through combinations of the coarse adjustment delay value and the fine adjustment delay value. The fine adjustment value is incremented through a predetermined range of values. Upon reaching an end of the range of fine adjustment delay values, the fine adjustment delay value is reset to a lesser value and the coarse adjustment value is incremented. The systematic sequence is continued until a current instantiation of the shifted data strobe aligns with a valid data window of the memory device.

Figure 1:
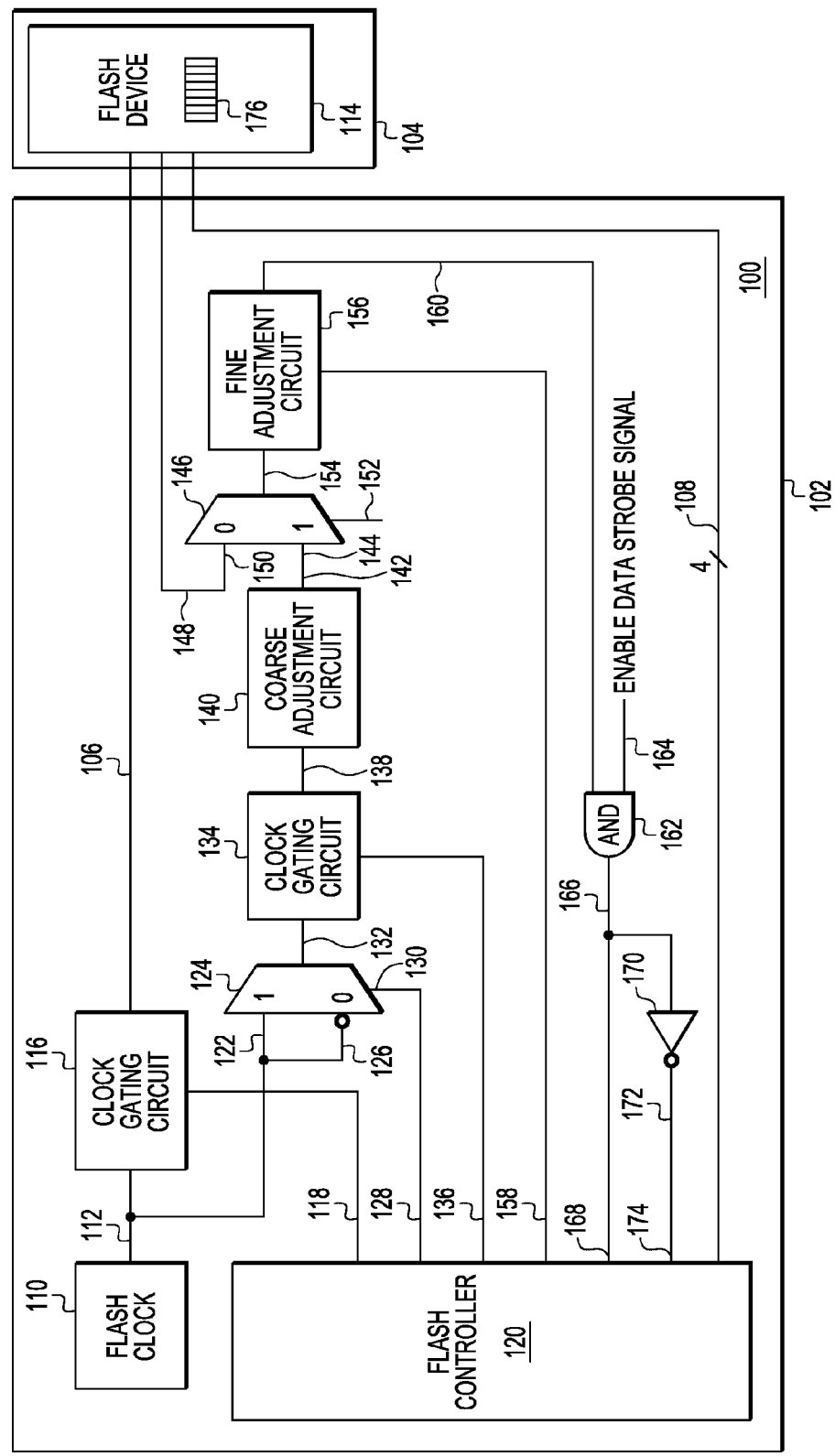
FIG. 1 is a schematic block diagram of a system for generating a local data strobe signal in accordance with an embodiment of the present invention.

Referring now to FIG. 1, a schematic block diagram of a system 100 for generating a shifted data strobe signal 160 within an integrated circuit 102 including a flash controller 120 is shown. The shifted data strobe signal 160 is used to sample data read from a flash device 114. While embodiments of the invention will be described using a flash device as an example of a memory that can be read using a data strobe signal shifted by an amount to align with the valid data window of the memory, the invention is not limited thereto. The invention can be used with suitable memory devices other than flash devices.

A free running clock signal 112 is generated by the integrated circuit 102 then gated by a clock gating circuit 134 depending on an enable dqs clock signal 136 asserted for the number of read data cycles in a transaction, forming a gated data strobe signal 138. The gated data strobe signal 138 is shifted in time in one or both of a coarse adjustment circuit 140 and a fine adjustment circuit 156, resulting in the shifted data strobe signal 160. A flexible instruction set sequence is sent by the flash controller 120 over a bidirectional bus 108 to the flash device 114 to access one or more sequential memory locations from which data can be read and compared to a known data pattern, which reading will be referred to herein as reading known data from a predetermined, programmed memory location 176. The read data is returned to the flash controller 120 over the bidirectional bus 108, where the read data is sampled on one or both of the rising and falling edges of the shifted data strobe signal 160.

The flash controller 120 compares the sampled data to data known to be in the memory location 176. If the sampled data does not match the known data, then the current instantiation of the shifted data strobe signal 160 is not aligned with the valid data window of the flash device 114. The gated data strobe signal 138 is then shifted by an incrementally different amount of time and the above sequence of steps is repeated until a match is achieved (between the data read and the known data). The coarse and find adjustment circuits 140 and 156 are controlled to systematically sequence through varying amounts of shifting until a match is achieved. Depending on the implementation, the algorithm could increase or decrease the amount of shifting to find a match. Achieving a match of the sampled data with the known data indicates that the instantiation of the shifted data strobe signal 160 that resulted in the match has an appropriate amount of shifting relative to the free running clock signal 112 to correctly sample data read from the flash device 114 under the current operating conditions.

A comparison can be performed in the flash controller 120 using either software or hardware. In hardware, an XOR gate (not shown) may be used to compare each bit, and an OR gate (not shown) may be used to combine the XOR gate outputs, as is known in the art.

The amount of shifting is stored in registers (not shown) in the flash controller 120 and used to generate the shifted data strobe signal 160 for each sampling of data read from the flash device 114, until the passage of a predetermined period of time from a previous calibration, a monitored parameter deviates from a predetermined value by a predetermined differential parameter amount, or a change in an operating condition invokes a recalibration of the amount of shifting appropriate for the then-current operating conditions. Examples of such operating conditions include, but are not limited to, temperature and voltage. One skilled in the art would know how to monitor temperature and voltage on the integrated circuits 102 and 104 and use the monitored quantities individually or in combination.

A flash clock 110 generates the free running clock signal 112 within the integrated circuit 102. The free running clock signal 112 is coupled via a clock gating circuit 116 as a gated clock signal 106 to the flash device 114. The gated clock signal 106 is provided to the flash device 114 when an enable signal 118 from the flash controller 120 is asserted to the clock gating circuit 116 to perform a transaction such as read data from or write data to the flash device 114. To save power, the enable signal 118 may be de-asserted when the gated clock signal 106 does not need to be applied to the flash device 114.

The free running clock signal 112 is used to generate the gated data strobe signal 138, which is shifted in time in one or both of the coarse adjustment circuit 140 and the fine adjustment circuit 156 to generate the shifted data strobe signal 160, which is used in the flash controller 120 to sample data read from the flash device 114. The flash device 114 may be fabricated on a separate integrated circuit 104 from the flash controller 120. In particular, the free running clock signal 112 is coupled as a first input 122 to a (2×1) multiplexer 124 and is inverted as a second input 126 to the multiplexer 124. A data strobe shift signal 128, generated by the flash controller 120, is coupled as a select input 130 to the multiplexer 124, the state of which determines whether the free running clock signal 112 or the inverse of the free running clock signal 112 is coupled as a selected clock signal 132 of the multiplexer 124.

The selected clock signal 132 is gated by the clock gating circuit 134 when the enable dqs clock signal 136 is asserted. The gated data strobe signal 138 is generated based on a flexible instruction set sequence sent by the flash controller 120 over the bidirectional bus 108 to the flash device 114. The gated data strobe signal 138 has a total number of high-to-low and low-to-high transitions that correspond to the number of beats of data to be returned from the flash device 114. A data beat is a set of data that is transferred at a particular edge transition. For example, the flash controller 120 sends a command to the flash device 114 requesting 32 bits of data. However, since there are only be 4 bi-directional data lines, the flash device 114 will send the 32 bits of data in eight sets of four bits of data. The flash device 114 sends the first set of data on an edge of the gated clock 106, then sends the second set of data on the next edge of the gated clock 106 and so on until all eight sets of data have been sent. The flash controller 120 knows in advance to expect eight such sets of data and generates the enable dqs clock signal 136 based on the number of data beats, eight in this example, of requested data.

The gated data strobe signal 138 is coupled as an input to the coarse adjustment circuit 140. The gated data strobe signal 138 is aligned with either the free running clock signal 112 or the inverse of the free running clock signal 112 as determined by the select input 130 of the multiplexer 124. The coarse adjustment circuit 140 provides a coarsely delayed version 142 of the gated data strobe signal 138. The operation of an embodiment of the coarse adjustment circuit 140 for use in the system 100 is explained in greater detail below with respect to FIG. 2.

The coarsely delayed data strobe signal 142 from the coarse adjustment circuit 140 is coupled as a first input 144 to a (2×1) multiplexer 146. The flash device 114 may provide a flash data strobe signal 148 that is coupled as a second input 150 to the multiplexer 146. When the flash device 114 provides the flash data strobe signal 148, either the flash data strobe signal 148 or the coarsely delayed data strobe signal 142 may be used. For the flash device 114 that does not provide the flash data strobe signal 148, the coarsely delayed data strobe signal 142 is selected. The select input 152 of the multiplexer 146 is set in a register (not shown) at "0" when the flash data strobe signal 148 is to be selected by the multiplexer 146, and is set at "1" when the coarsely delayed data strobe signal 142 is to be selected by the multiplexer 146. With the select input 152 set to a "1", the coarsely delayed data strobe signal 142 is coupled at an output 154 of the multiplexer 146 as the input to the fine adjustment circuit 156.

The fine adjustment circuit 156 receives a decoded tab identifier 158 from the flash controller 120 that determines the delay introduced by the fine adjustment circuit 156 in generating the shifted data strobe signal 160. The fine adjustment circuit 156 introduces a delay in small increments, if needed, to further shift the coarsely delayed data strobe signal 142 so that data read from the flash device 114 appears to be shifted toward the center of a clock period. The operation of an embodiment of the fine adjustment circuit 156 for use in the system 100 is explained in greater detail below with respect to FIG. 3.

The shifted data strobe signal 160 is coupled to the flash controller 120 through a first input of an AND gate 162. An enable data strobe signal 164 from a register (not shown) is input to a second input of the AND gate 162. The enable data strobe signal 164 is a "1" when the shifted data strobe signal 160 is to be passed by the AND gate 162 and a "0" when the shifted data strobe signal 160 is not to be passed by the AND gate 162. The enable data strobe signal 164 prevents spurious transitions generated while configuring the coarse adjustment circuit 140 and the fine adjustment circuit 156 from being received at the flash controller 120, thereby deglitching the shifted data strobe signal 166.

The shifted data strobe signal 166 is coupled to the flash controller 120 at an input 168 for use as a strobe to sample data read from the flash device 114 in a single-data-rate mode of operation. The shifted data strobe signal 166 from the AND gate 162 is also inverted by an inverter 170 to provide the inverted shifted data strobe signal 172. The inverted shifted data strobe signal 172 is coupled to the flash controller 120 at an input 174 to support a double-data-rate (DDR) mode of operation. In an alternative embodiment of the invention, one skilled in the art could use the shifted data strobe signal 166 with negative-edge-triggered flip-flops to obviate the need to generate the inverted shifted data strobe signal 172. Data read from the flash device 114 is stored in an asynchronous first-in, first-out (FIFO) memory (not shown) in the flash controller 120 for further processing. The FIFO memory operates with the shifted data strobe signal, either 166 or 172 depending on the data rate, as a clock. However, the shifted data strobe signals 166 and 172 are asynchronous to the free running clock signal 112.

Figure 2:
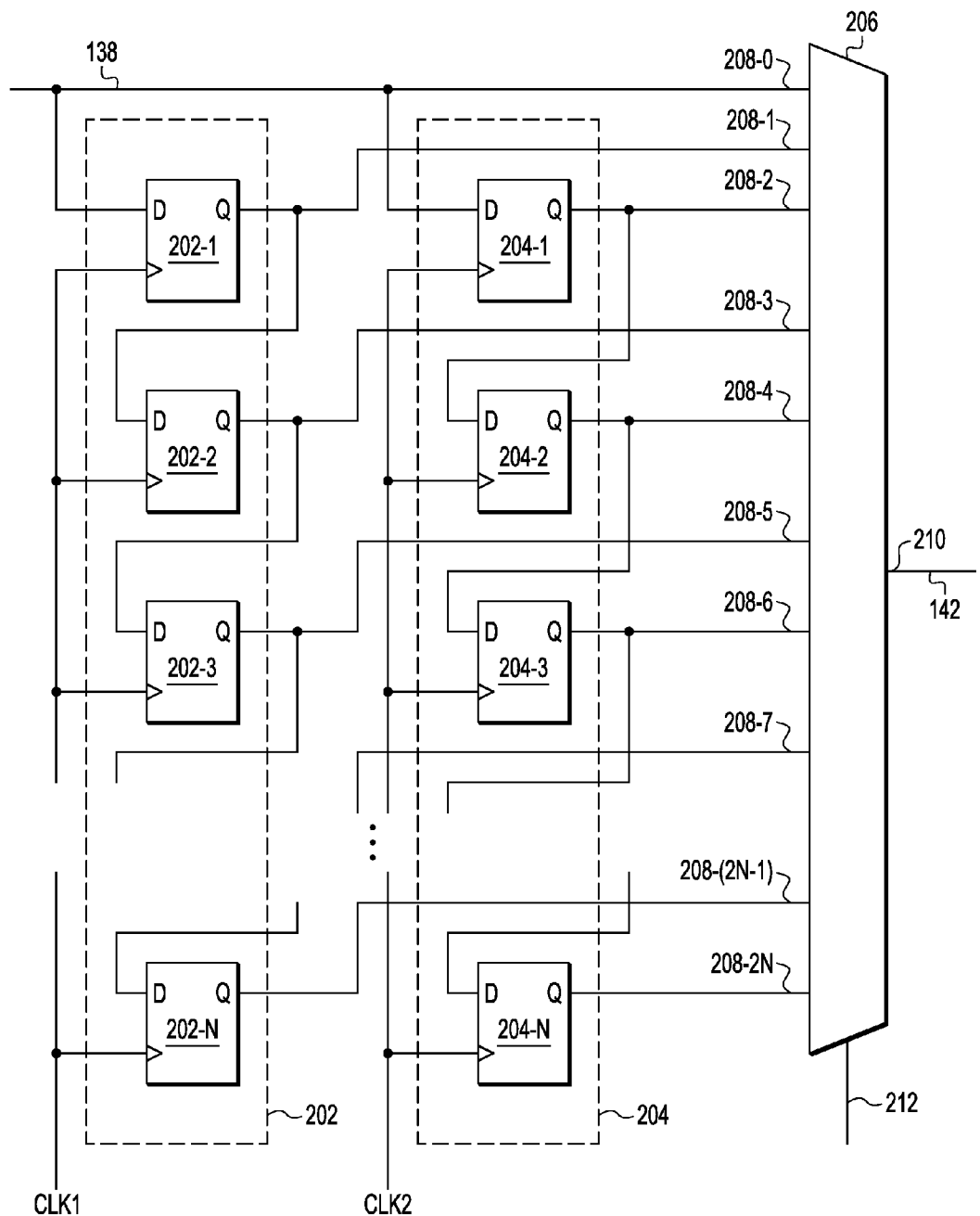
FIG. 2 is a schematic block diagram of a coarse adjustment circuit for the system of FIG. 1.

FIG. 2 is a block diagram of an embodiment of the coarse adjustment circuit 140 of the system 100 of FIG. 1. This embodiment of the coarse adjustment circuit 140 includes first and second serial-in, serial-out shift registers 202 and 204 and a multiplexer 206. The coarse adjustment circuit 140 receives the gated data strobe signal 138 from the clock gating circuit 134. The gated data strobe signal 138 is coupled to an input 208-0 of the multiplexer 206 and to the D input of a first-stage flip-flop 202-1. The Q output of the first-stage flip-flop 202-1 is coupled as the input 208-1 of the multiplexer 206 and to the D input of a second-stage flip-flop 202-2. The Q output of the second-stage flip-flop 202-2 is coupled to an input 208-3 of the multiplexer 206 and to a D input of a third-stage flip-flop 202-3, and so forth through each of the N stages of the shift register 202. Note that the Q output of an Nth-stage flip-flop 202-N is coupled only as an input 208-(2N-1) to the multiplexer 206.

Operation of the shift register 204 is similar to the operation of the shift register 202. In particular, the gated data strobe signal 138 is coupled to the D input of a first-stage flip-flop 204-1. The Q output of the first-stage flip-flop 204-1 is coupled to an input 208-2 of the multiplexer 206 and to a D input of a second-stage flip-flop 204-2. The Q output of the second-stage flip-flop 204-2 is coupled to an input 208-4 of the multiplexer 206 and to the D input of a third-stage flip-flop 204-3, and so forth through each of the N stages of the shift register 204. Note that the Q output of an Nth-stage flip-flop 204-N is coupled only as the input 208-2N of the multiplexer 206.

The gated data strobe signal 138 is sampled periodically, and the samples are shifted into and through each of the N stages of the shift registers 202 and 204 by respective clock signals CLK1 and CLK2. In one embodiment, CLK2 is twice the frequency of the free running clock signal 112 of FIG. 1. CLK1 is an inverted version of CLK 2, and thus is a one-half clock period delayed version of CLK2. As is known in the art, CLK1 is simultaneously applied to all N stages of the first shift register 202 to sample the gated data strobe signal 138 and to shift the gated data strobe signal 138 samples through each of the N stages of the first shift register 202. With each clock cycle of CLK1, the gated data strobe signal 138 is captured by the first-stage flip-flop 202-1 of the first shift register 202. The data stored in each stage of the first shift register 202 is shifted to the next stage. The number of stages, N, in the first shift register 202, must be large enough to provide adequate storage to achieve the coarse shifting desired.

The second shift register 204 operates in a similar manner with CLK2. The gated data strobe signal 138 is coupled as the D input of the first-stage flip-flop 204-1. CLK2 is applied simultaneously to all stages of the second register 204 to shift the gated data strobe signal 138 through each of the N stages of the second shift register 204. Typically, the number of stages in the first and second shift registers 202 and 204 are the same, although the invention is not limited thereto.

In the embodiment of FIG. 2, since CLK1 and CLK2 are twice the frequency of the free running clock signal 112, and are inverse instantiations of each other, the samples taken by the two shift registers 202 and 204 are at intervals of 1/4 of a clock period of the free running clock signal 112. In some embodiments of the invention, CLK1 and CLK2 are a higher multiple of the frequency of the free running clock signal 112, which results in a narrower coarse adjustment increment. For example, when CLK1 and CLK2 are four times the frequency of the free running clock 112, the coarse adjustment is of one-eighth of a clock period of the free running clock signal 112.

The first input 208-0 to the multiplexer 206 is the gated data strobe signal 138, which can be selected as an output 210 of the multiplexer 206 by setting the multiplexer's select input 212 to a binary representation of "0". The select input 212 is a static signal (not shown in FIG. 1) generated by the flash controller 120 and stored in programmable register bits (not shown) within the flash controller 120 and used to select a coarse delay adjustment value to be applied to the gated data strobe signal 138.

The second input 208-1 to the multiplexer 206 is the gated data strobe signal 138 that is shifted by 1/4 of a clock cycle of the free running clock signal 112. The second input 208-1 can be selected as the output 210 of the multiplexer 206 by setting the select input 212 to a binary representation of "1" in the programmable register bits within the flash controller 120.

The third input 208-2 to the multiplexer 206 is the gated data strobe signal 138 that is shifted by 2/4 of a clock cycle of the free running clock signal 112. The third input 208-2 can be selected as the output 210 of the multiplexer 206 by setting the select input 212 to a binary representation of "2" in the programmable register bits within the flash controller 120.

The fourth input 208-3 to the multiplexer 206 is the gated data strobe signal 138 that is shifted by 3/4 of a clock cycle of the free running clock signal 112. The fourth input 208-3 can be selected as the output 210 of the multiplexer 206 by setting the select input 212 to a binary representation of "3" in the programmable register bits within the flash controller 120.

The fifth input 208-4 to the multiplexer 206 is the gated data strobe signal 138 that is shifted by 4/4 of a clock cycle of the free running clock signal 112. The fifth input 208-4 can be selected as the output 210 of the multiplexer 206 by setting the select input 212 to a binary representation of "4" in the programmable register bits within the flash controller 120.

The sixth input 208-5 to the multiplexer 206 is the gated data strobe signal 138 that is shifted by 5/4 of a clock cycle of the free running clock signal 112. The sixth input 208-5 can be selected as the output 210 of the multiplexer 206 by setting the select input 212 to a binary representation of "5" in the programmable register bits within the flash controller 120.

As can be seen from the first through the sixth inputs 208-0 through 208-5 to the multiplexer 206, the gated data strobe signal 138 can be shifted by a range from no delay to a delay that is less than one clock cycle of the free running clock signal 112, to a delay that is more than one clock cycle of the free running clock signal 112. The bit width of the select input 212 may expand to accommodate larger delays as the number of stages, N, in the first and second shift registers 202 and 204 is increased.

The output signal 210 of the multiplexer 206 is a delayed version of the gated data strobe signal 138 identified in FIG. 1 as the coarse adjustment circuit output 142. The coarse adjustment circuit output 142 is provided as the input signal 154 to the fine adjustment circuit 156 via the multiplexer 146 when the select input 152 is a logic "1".

Figure 3:
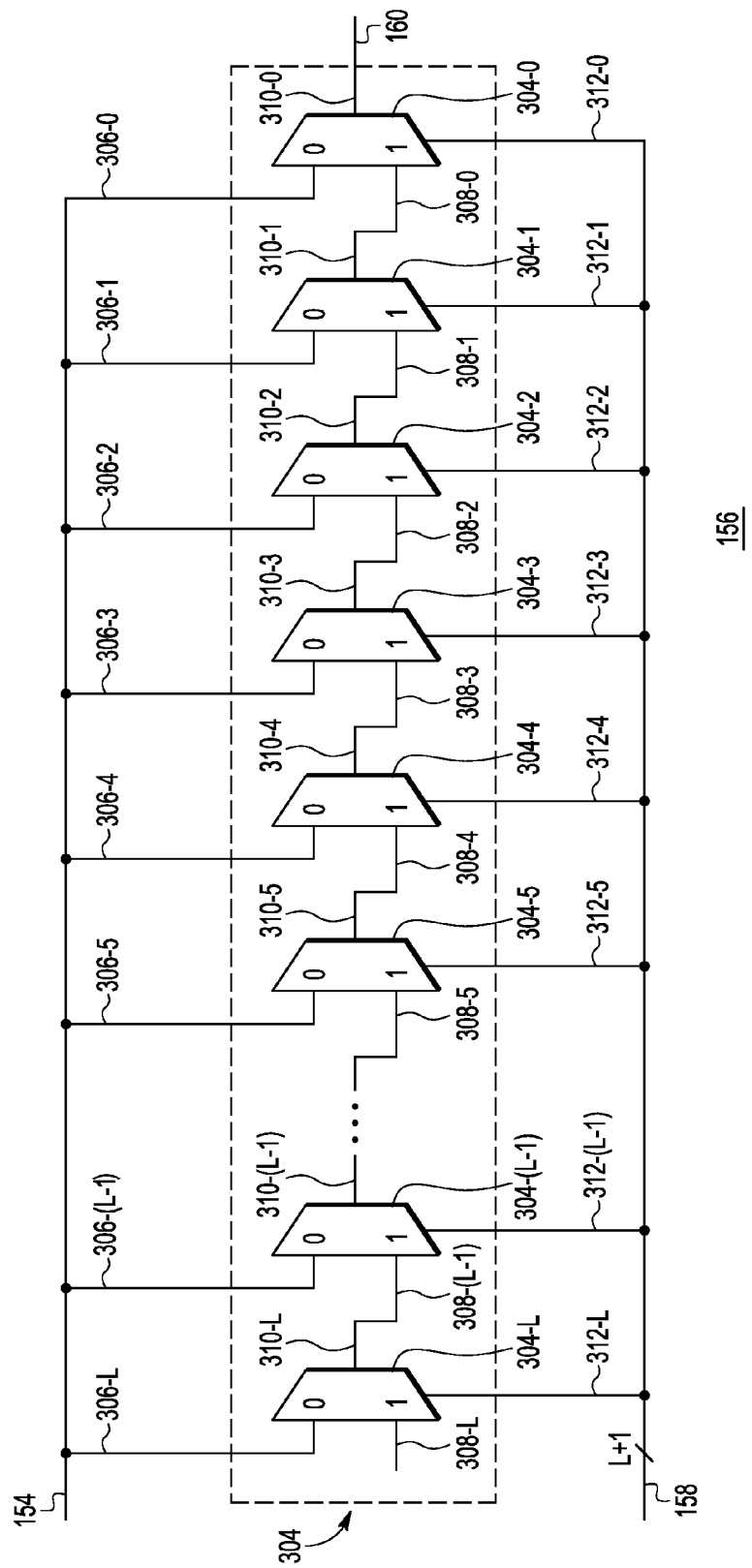
FIG. 3 is a schematic block diagram of a fine adjustment circuit for the system of FIG. 1.

FIG. 3 is a block diagram of an embodiment of the fine adjustment circuit 156 for the system 100 of FIG. 1. The fine adjustment circuit 156 includes a series delay line 304 of (L+1) delay elements 304-0 through 304-L. The delay elements 304-0 through 304-L in the embodiment illustrated in FIG. 3 are identical (2×1) multiplexers 304-0 through 304-L, and each of the multiplexers 304-0 through 304-L introduces the same, nominal, propagation delay to a signal passing therethrough.

The fine adjustment circuit 156 receives the delayed data strobe signal 154 from the multiplexer 146 of FIG. 1. As shown in FIG. 3, the delayed data strobe signal 154 is coupled to the first input 306-i of each corresponding multiplexer

304-$i$, $i=0, \ldots, L$. The second input 308-$j$ of each of the corresponding multiplexers 304-$j$ receives the output 310-$j+1$ of the corresponding preceding multiplexer 304-$j+1$ in the delay line 304, $j=0, \ldots, L-1$, where the multiplexer 304-L receives a ground signal on its second input 308-L.

The series delay line 304 is controlled to introduce a selectable delay. The delay of each multiplexer 304-$i$ is known. The delay line 304 is controlled by the select inputs 312-0 to 312-L to have only one of the (L+1) multiplexers 304-0 to 304-L at a time with a select input that is a logic low. As such, the delay introduced by delay line 304 is controlled, known, and may use all or less than all of the delay elements 304-0 through 304-L.

The number of the multiplexers 304-0 to 304-L required in the series delay line 304 of the fine adjustment circuit 156 is determined as follows. It is desired to have at least three (K) samples of data that are identical within the valid data window. The minimum duration of the valid data window can be determined from the flash device 114 manufacturer's data sheet. Dividing the minimum duration of the valid data window by a number of samples to fall within the valid data window such as three (K) determines the average time delay represented by a delay element 304-0 through 304-L in the fine adjustment circuit 156. The number of fine adjustment delay elements (e.g., multiplexers) used to introduce a range of fine adjustment delay values is determined by dividing the duration of the time represented by each incremental stage of the first shift register 202 or the second shift register 204 in the coarse adjustment circuit 140 by the average time delay represented by a delay element 304-0 through 304-L in the fine adjustment circuit 156. In one embodiment, the multiplexers 304-0 through 304-L are each designed to introduce a delay of about 70 picoseconds to about 120 picoseconds depending on the application requirements.

The select input 312-$i$ to each multiplexer 304-$i$ of the series delay line 304 is decoded by the flash controller 120 from a multi-bit tap identifier and presented as the (L+1)-bit decoded tap identifier 158. In the implementation of FIG. 3, the decoded tap identifier 158 has L bits that are logic value 1 (i.e., logic high) and only one bit that is logic value 0 (i.e., logic low). By way of example, for an implementation of the series delay line 304 having L+1=64 multiplexers 304-0 to 304-L, a tap identifier of six bits is sufficient to identify sixty four select inputs 312-$i$ having one of two binary states. The select input of one multiplexer 304-$i$ will have a select input 312-$i$ that is a logic low. The tap identifier is decoded, such as by software or a look-up table, to provide a select input to each of the multiplexers 304-0 to 304-L in the series delay line 304. The decoded tap identifier 158 switches the sampled and delayed data strobe signal 154 to the output 310-$i$ of only one of the multiplexers 304-0 to 304-L (i.e., the (i)th multiplexer 304-$i$) by setting the state of the corresponding select input 312-$i$ identified by the decoded tap identifier 158 from a logic 1 to a logic 0.

The sampled and delayed data strobe signal 154, which has been delayed by a coarse adjustment delay value in the coarse adjustment circuit 140, is delayed by a fine adjustment delay value in the fine adjustment circuit 156 the aggregate of the delays introduced by the multiplexers 304-M through 304-0 as the sampled and delayed data strobe signal 154 passes through the multiplexers 304-$i$ through 304-0, to emerge from the series delay line 304 as the output 310-0 of the multiplexer 304-0 as the shifted data strobe 160.

In the embodiment of the fine adjustment circuit 156 disclosed in FIG. 3, the total delay introduced by the series delay line 304 is the number of multiplexers through which the signal passes multiplied by the nominal delay of each multiplexer 304-$i$. While each multiplexer 304-$i$ is designed to introduce ostensibly the same delay, due to variations in conditions of process, voltage, and temperature, there may be variations from multiplexer to multiplexer within the series delay line 304. Furthermore, the number of stages and the delay introduced by each stage of the series delay line 304 can be modified to accommodate design requirements as described above.

The maximum delay that can be introduced by the fine adjustment circuit 156 is the product of the nominal delay of each multiplexer 304-$i$ multiplied by the number of multiplexers, L+1. The delay needed for a particular application can be accommodated by designing multiplexers or other delay elements, customizing the nominal delay of each delay element, and appropriately selecting the number of delay elements. The incremental delay introduced by each delay stage of the fine adjustment circuit 156 is less than the incremental delay introduced by each stage of shift registers 202 and 204 in the coarse adjustment circuit 140. The delay of each stage of the coarse adjustment circuit 140 is dependent on the frequency of operation of clocks CLK1 and CLK2 which result in the coarse adjustment circuit 140 not being impacted by on-chip variations to the same extent as the multiplexer-based delay stages of the fine adjustment circuit 156. The total range of the fine adjustment delay values of the fine adjustment circuit 156 is approximately equal to, and in some embodiments of the invention may be slightly greater than, each increment of the coarse adjustment circuit 140.

Although the fine adjustment circuit 156 has been described as having the multiplexers 304-0 to 304-L as delay elements such that a select input signal 312-$i$ of 0, a logic low, would switch the first input 306-$i$ to the multiplexer 304-$i$ to the output 310-$i$, the invention is not limited thereto. One skilled in the art could design a delay chain using delay elements of appropriate incremental delay other than multiplexers that provides a repeatable, uniform delay to shift an input signal.

Figure 4:
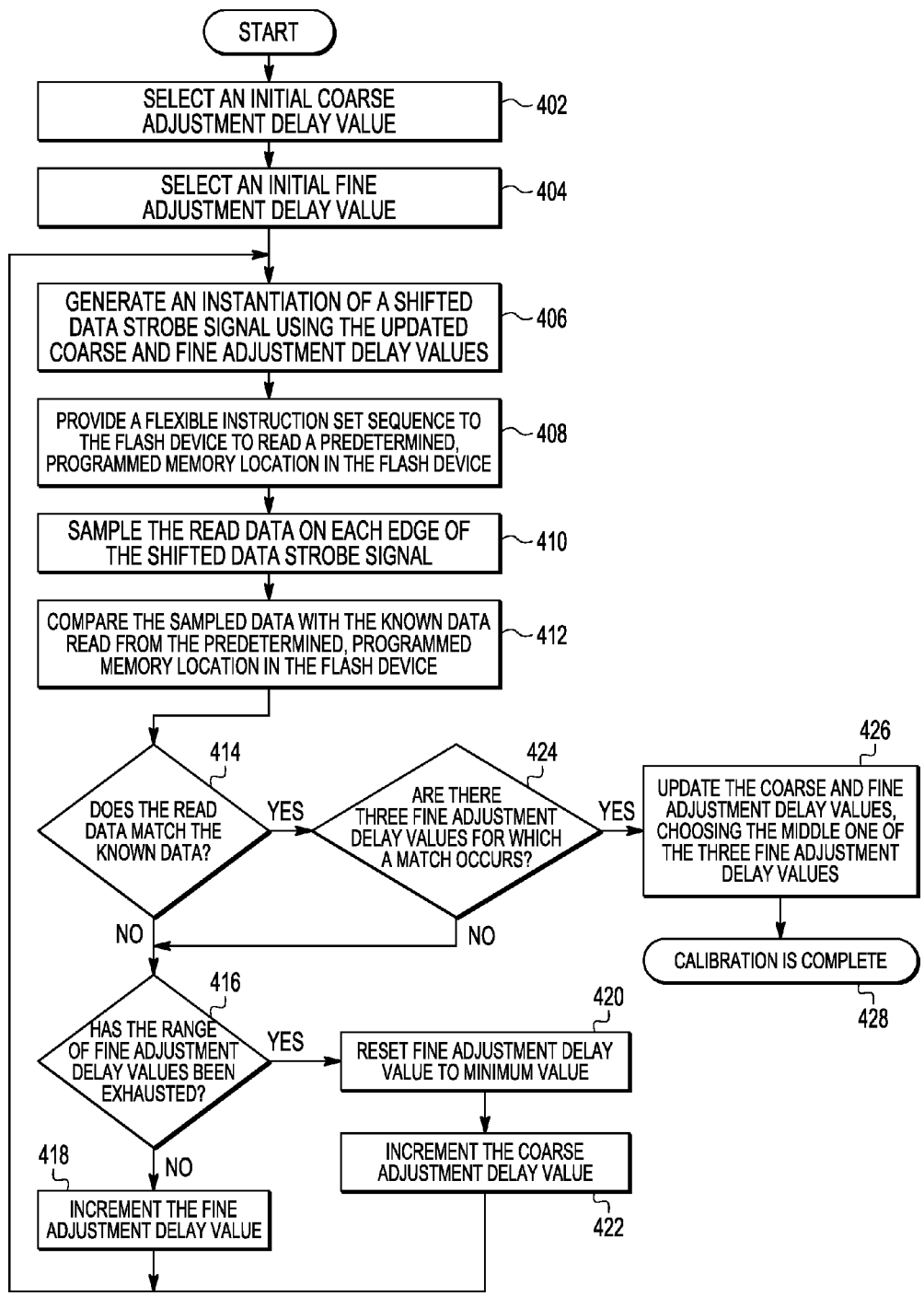
FIG. 4 is a flow chart of a calibration process in accordance with an embodiment of the invention.

FIG. 4 is a simplified flow chart of a method for calibrating the coarse and fine adjustment delay values for use in generating the data strobe signal 160 by shifting the free running clock signal 112 of FIG. 1 according to an embodiment of the invention. The method of FIG. 4 can be used for an initial calibration of the coarse and fine adjustment delay values or a recalibration, based on the passage of a predetermined amount of time since the last calibration or due to a deviation in a monitored parameter in one or both of the integrated circuits 102 and 104, such as temperature or voltage, to reevaluate the coarse and fine adjustment delay values in response to the changed operating conditions.

In step 402, an initial coarse adjustment delay value is selected. In one implementation, the initial coarse adjustment delay value is the minimum coarse adjustment delay value, such as zero. If a priori knowledge is available, then a larger initial coarse adjustment delay value may be used. Such a priori knowledge may be available during recalibration where a non-zero initial coarse adjustment delay value, such as a value smaller than the coarse adjustment delay value, as determined by the most recent calibration process.

In step 404, an initial fine adjustment delay value is selected. In one implementation, the initial fine adjustment delay value is the minimum fine adjustment delay value, such as the nominal delay of a single multiplexer. If a priori knowledge is available, then a larger initial fine adjustment delay value may be used. Such a priori knowledge may be available during a recalibration where a non-zero initial fine adjustment delay value, such as a value smaller than the fine adjustment delay value, as determined by the most recent calibration process.

In step 406, an instantiation of the shifted data strobe signal 160 is generated under control of the flash controller 120, for example, by the system 100 described in FIG. 1. The instantiation of the shifted data strobe signal 160 initially has almost no delay because the coarse adjustment delay value is zero and the fine adjustment delay value is minimal, e.g., the delay introduced by one delay element 304-0 of FIG. 3. In subsequent iterations, the coarse adjustment circuit 140 and the fine adjustment circuit 156 are controlled to systematically sequence through varying, typically increasing but one could sequence through decreasing, amounts of delay until a match is achieved.

In step 408, a flexible instruction set sequence is sent by the flash controller 120 over the bidirectional bus 108 to the flash device 114 to read known data from a predetermined, programmed memory location 176. The contents of the memory location are a known sequence of data and may be, for example, a known Barker Code.

In step 410, the read data is transferred over the bidirectional bus 108 to the flash controller 120 where the read data is sampled on one or both of the rising and falling edges of the current instantiation of the shifted data strobe signal 166 or 172, as appropriate for the data rate, and the samples are stored in an asynchronous FIFO memory (not shown).

In step 412, the flash controller 120 compares the sampled data to data known to be in the memory location 176. A comparison can be achieved in software or hardware as is known in the art. In hardware, an XOR gate can be used for each point to be compared, and an OR gate to combine the XOR gate outputs. Achieving a match of the sampled data with the data known to be in memory location 176 indicates the current instantiation of the shifted data strobe signal 160 that resulted in the match is an appropriate amount of delay of free running clock signal 112 to generate the shifted data strobe signal 166 to correctly read data from the flash device 114 under the current operating conditions.

In step 414, an assessment is made whether the sampled data matches the data known to be in the predetermined, programmed memory location 176 of the flash device 114. If the sampled data does not match the data known to be in memory location 176, then the current instantiation of the shifted data strobe signal 160 is not aligned with the valid data window of the flash device 114 to correctly read and sample the known data. In that case, the comparison results in a negative determination, and, in step 416, an assessment is made whether the range of fine adjustment delay values has been exhausted.

If the range of fine adjustment delay values has not been exhausted, then, in step 418, the fine adjustment delay value is incremented to include an additional multiplexer delay. Step 406 is executed again with the updated fine adjustment delay value, and subsequent steps in the flow chart of FIG. 4 are executed until either the sampled data matches the known data in memory location 176 of the flash device 114 or the range of fine adjustment delay values has been exhausted in step 416.

When the range of fine adjustment delay values has been exhausted in step 416, an affirmative result in step 416 branches to execute step 420 in which the fine adjustment delay value is reset to the minimum delay.

In step 422, since the range of the possible fine adjustment delay values has been exhausted with the coarse adjustment delay value at a given value, the coarse adjustment delay value is increased to the next larger coarse adjustment delay value. This is achieved by the select input 212 to multiplexer 206 being increased to provide the next larger delay input to multiplexer 206 as the output 210 which is also the output 142 of the coarse adjustment circuit 140. After executing step 422, step 406 is executed again with the updated fine adjustment and coarse adjustment delay values and subsequent steps are executed.

In step 414, an assessment is made whether the sampled data matches the data known to be in the predetermined, programmed memory location 176 of the flash device 114. If the sampled data matches the data known to be in memory location 176, an affirmative result in step 414 branches to execute step 424 in which an assessment is made whether there are three fine adjustment delay values for which there is a match. In some embodiments of the invention, the fine adjustment delay value matches occur at consecutive fine adjustment delay values. In other embodiments of the invention, the fine adjustment delay value matches occur at multiple fine adjustment delay values that are associated with the same coarse delay value. If there are fewer than three fine adjustment delay values for which there is a match, then step 416 is executed and another iteration back to step 406 follows.

When, in step 414, the sampled data matches the data known to be in the memory location 176, and in step 424, there are three (or, more generally, K, where K is an integer number greater than 1) consecutive fine adjustment delay values for which there is a match, step 426 is executed in which the center one of the three fine adjustment delay values (or, more generally, a fine adjustment delay value near the center of the K fine adjustment delay values) is selected as the fine adjustment delay value. The fine adjustment delay value and the coarse adjustment delay value are updated in registers (not shown) in flash controller 120 for use in sampling unknown data from the flash device 114, thereby completing a calibration as indicated in step 428.

Achieving a match of the sampled data with the known data read from the predetermined, programmed memory location 176 indicates that the current instantiation of the shifted data strobe signal 166 is aligned with the valid data window of the flash device 114 to correctly sample the known data read from the predetermined, programmed memory location under the current operating conditions. The calibration process may be invoked during slow background operation, upon powering-up the flash device 114, or by the passage of a predetermined period of time since a prior calibration. Alternatively, the calibration process may be invoked by a monitored parameter deviating from a predetermined parameter value by a predetermined differential parameter value. Parameters that may be monitored to invoke a calibration include but are not limited to temperature of the integrated circuit 102 on which the flash controller 120 is fabricated or the integrated circuit 104 on which the flash device 114 is fabricated and operational voltage on the integrated circuit 102, or the integrated circuit 104. One skilled in the art would know how to design and implement a circuit to invoke the recalibration process described herein based on the events and monitored parameters described herein. Circuits could reside in the flash controller 120 as hardware of software or a combination of hardware and software.

In some embodiments of the invention, a recalibration may be initiated when a monitored or measured temperature on the memory device deviates, by increasing or decreasing, from a predetermined temperature by a predetermined differential temperature. The predetermined temperature and the predetermined differential temperature in a particular application will depend upon the temperature range over which the memory device is designed to operate.

In other embodiments of the invention, a recalibration may be initiated when a monitored or measured voltage on the memory device deviates, by increasing or decreasing, from a predetermined voltage by a predetermined differential voltage. The predetermined voltage and the predetermined differential voltage in a particular application will depend upon the voltage at which the memory device is designed to operate and the voltage range over which the memory device is designed to operate.

Although an embodiment of a system 100 for generating the shifted data strobe signal 166 has been described as being fabricated on the same integrated circuit 102 as the flash controller 120, other embodiments may have circuitry for generating a data strobe signal for memory devices utilizing a coarse adjustment circuit followed by a fine adjustment circuit within the integrated circuit 104 containing the memory or within another integrated circuit.

Figure 5:
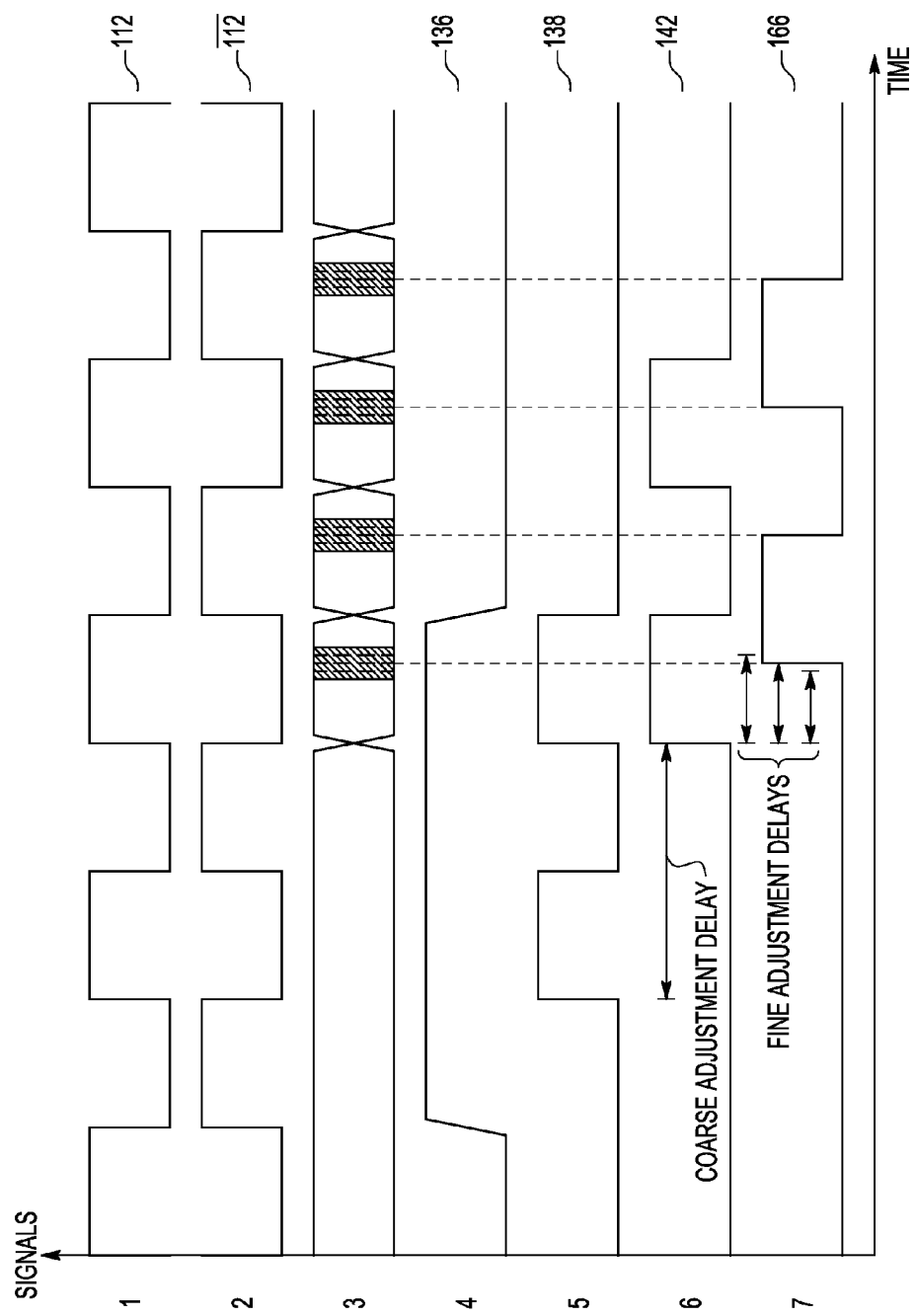
FIG. 5 is a timing diagram illustrating shifting of a internal data strobe signal to align with the valid data window of a memory device.

FIG. 5 is a timing diagram illustrating shifting of the free running clock signal 112 of FIG. 1 to generate a data strobe signal 166 that is aligned with the valid data window of the flash device 114 for the method disclosed in the flow diagram of FIG. 4.

Curve 1 illustrates the free running clock signal 112.

Curve 2 illustrates the inverse of the free running clock signal 112.

Curve 3 illustrates four bits of data read from the predetermined, programmed memory location 176 in the flash device 114 being received by the system 100.

Curve 4 illustrates the "enable dqs clock signal" of the flash controller 120 to the clock gating circuit 134 to pass four edge transitions indicating that four data beats are being read from the flash device 114 and received by the system 100.

Curve 5 illustrates the gated data strobe signal 138 before passing through the coarse adjustment circuit 140.

Curve 6 illustrates the coarse adjustment circuit output 142 as the gated data strobe signal 138 shifted by a delay introduced in coarse delay circuit 140.

Curve 7 illustrates the deglitched shifted data strobe signal 166 after curve 6 passes through the fine adjustment circuit 156. The deglitched shifted data strobe signal 166 is used to sample data, on one or both of the rising and falling clock edges, received from the flash device 114. Samples of curve 3 are taken within the shaded areas of curve 3 at both the rising and falling edges of the shifted data strobe signal 166. The samples of curve 3 are illustrated as taking the center one of three samples at multiple fine adjustment delay values and the same coarse adjustment delay value.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A method for generating a shifted strobe signal for sampling data read from a memory device, the method comprising:
   (a) generating a shifted strobe signal by applying a coarse adjustment delay value and a fine adjustment delay value to a clock signal;
   (b) reading data stored in a predetermined memory location of the memory device that is pre-programmed with known data;
   (c) sampling the read data using the shifted strobe signal;
   (d) determining whether the sampled data matches the known data; and
   (e) updating one or both of the coarse and fine adjustment delay values and repeating steps (a)-(d) until the sampled data matches the known data, whereby the shifted data strobe is aligned with a valid data window of the memory device.

2. The method of claim 1, wherein, after the fine adjustment delay value is incremented through a predetermined range of fine adjustment delay values, the fine adjustment delay value is reset to a smaller fine adjustment delay value, and the coarse adjustment delay value is incremented to a next larger delay value.

3. The method of claim 2, wherein resetting the fine adjustment delay value to a smaller delay value resets the fine adjustment delay value to a predetermined minimum fine adjustment delay value.

4. The method of claim 1, further comprising:
   when the sampled data matches the known data, storing the fine adjustment delay value and the coarse adjustment delay value for repeated use in generating the shifted strobe signal for sampling unknown data read from the memory device.

5. The method of claim 1, wherein step (e) comprises:
updating one or both of the coarse and fine adjustment delay values until matches occur in K>1 iterations of steps (a)-(d); and
further comprising storing the coarse and fine adjustment delay values for a middle one of the K iterations for repeated use in generating the shifted strobe signal for sampling unknown data read from the memory device.

6. The method of claim 5, wherein the fine adjustment delay value matches occur at multiple fine adjustment delay values and a single coarse adjustment delay value.

7. The method of claim 1, wherein the memory device is a flash memory device.

8. The method of claim 1, further comprising deglitching the shifted strobe signal.

9. The method of claim 1, wherein the method is invoked by one of powering-up the memory device, passage of a predetermined period of time from a previous execution of the method, and during a slow background operation.

10. The method of claim 1, wherein the method is invoked by a monitored parameter on the memory device deviating from a predetermined parameter value by a predetermined differential value.

11. The method of claim 10, wherein the monitored parameter is one of temperature and voltage.

12. A circuit for generating a shifted strobe signal for sampling data read from a memory device, the circuit comprising:
a coarse adjustment circuit for applying a coarse adjustment delay value to a clock signal;
a fine adjustment circuit for applying a fine adjustment delay value to the clock signal; and
a control circuit for controlling the coarse and fine adjustment circuits to systematically sequence through combinations of the coarse adjustment delay value and the fine adjustment delay value incrementing the fine adjustment value through a predetermined range of values and upon reaching an end of the range of fine adjustment values resetting the fine adjustment delay value to a lesser value and incrementing the coarse adjustment delay value to a next higher value until a current instantiation of the shifted data strobe is aligned with a valid data window of the memory device.

13. The circuit of claim 12, wherein the control circuit samples data read from the memory device using the generated shifted strobe signal.

14. The circuit of claim 13, wherein the control circuit compares the sampled data to known data stored in a predetermined, programmed memory location of the memory device.

15. The circuit of claim 12, further comprising:
a monitoring circuit for monitoring a parameter and deviation of the parameter from a set point, the monitoring circuit for invoking a calibration process upon the parameter deviating from the set point by a predetermined differential value.

16. The circuit of claim 12, further comprising:
a timer circuit for measuring elapsed time from initiation of a calibration process, wherein the timer initiates a subsequent calibration process upon passage of a predetermined time period.

17. A circuit for generating a shifted strobe signal for sampling data read from a memory device, the circuit comprising:
a coarse adjustment circuit for applying a coarse adjustment delay value to a clock signal;
a fine adjustment circuit for applying a fine adjustment delay value to the clock signal;
a control circuit for controlling the coarse and fine adjustment circuits to systematically sequence through combinations of the coarse adjustment delay value and the fine adjustment delay value incrementing the fine adjustment value through a predetermined range of values and upon reaching an end of the range of fine adjustment values resetting the fine adjustment delay value to a lesser value and incrementing the coarse adjustment delay value to a next higher value until a current instantiation of the shifted data strobe aligns with a valid data window of the memory device;
a monitoring circuit for monitoring a parameter of the memory device and deviation of the parameter from a set point, the monitoring circuit for invoking a calibration process upon the parameter deviating from the set point by a predetermined differential parameter value; and
a timer circuit for measuring elapsed time from initiation of a calibration process of the memory device, the timer for initiating a subsequent calibration process upon passage of a predetermined time period.

* * * * *